US007232729B1

(12) United States Patent
Wong

(10) Patent No.: US 7,232,729 B1
(45) Date of Patent: Jun. 19, 2007

(54) METHOD FOR MANUFACTURING A DOUBLE BITLINE IMPLANT

(75) Inventor: Nga-Ching Wong, San Jose, CA (US)

(73) Assignee: Spansion LLC, Sunnyvale, CA (US)

(*) Notice: Subject to any disclaimer, the term of this patent is extended or adjusted under 35 U.S.C. 154(b) by 235 days.

(21) Appl. No.: 10/431,321

(22) Filed: May 6, 2003

(51) Int. Cl.
H01L 21/336 (2006.01)

(52) U.S. Cl. ............... 438/301; 438/305; 257/E21.135

(58) Field of Classification Search ........ 257/335–343, 257/E21.135; 438/45, 163, 194, 217, 229–232, 438/289, 301–303, 306, 510, 514, 517, 542, 438/546–548, 305
See application file for complete search history.

(56) References Cited

U.S. PATENT DOCUMENTS

| | | | | |
|---|---|---|---|---|
| 5,308,780 A * | 5/1994 | Chou et al. | ................ | 438/302 |
| 5,407,852 A * | 4/1995 | Ghio et al. | ................ | 438/130 |
| 5,512,506 A * | 4/1996 | Chang et al. | ............... | 438/305 |
| 5,545,575 A * | 8/1996 | Cheng et al. | ............... | 438/304 |
| 5,631,485 A * | 5/1997 | Wei et al. | ................... | 257/344 |
| 5,646,430 A * | 7/1997 | Kaya et al. | ................ | 257/322 |
| 5,670,389 A * | 9/1997 | Huang et al. | ............... | 438/163 |
| 5,866,448 A * | 2/1999 | Pradeep et al. | ............ | 438/231 |
| 5,960,283 A * | 9/1999 | Sato | ........................... | 438/257 |
| 5,985,727 A * | 11/1999 | Burr | ........................... | 438/302 |
| 6,104,063 A * | 8/2000 | Fulford et al. | ............... | 257/344 |
| 6,153,483 A * | 11/2000 | Yeh et al. | ................... | 438/299 |
| 6,187,620 B1 * | 2/2001 | Fulford et al. | ............... | 438/230 |
| 6,285,056 B1 * | 9/2001 | Kocon | ......................... | 257/328 |
| 6,294,433 B1 * | 9/2001 | Luning | ........................ | 438/301 |
| 6,297,535 B1 * | 10/2001 | Gardner et al. | ............. | 257/344 |
| 6,368,926 B1 * | 4/2002 | Wu | .............................. | 438/300 |
| 6,383,883 B1 * | 5/2002 | Cheng et al. | ............... | 438/305 |
| 6,399,973 B1 * | 6/2002 | Roberds | ...................... | 257/288 |
| 6,455,362 B1 * | 9/2002 | Tran et al. | ................... | 438/194 |
| 6,524,916 B1 * | 2/2003 | Scholer et al. | .............. | 438/270 |
| 6,660,605 B1 * | 12/2003 | Liu | .............................. | 438/307 |
| 6,723,609 B2 * | 4/2004 | Yang et al. | ................. | 438/303 |
| 2002/0153559 A1 * | 10/2002 | Yeap et al. | .................. | 257/335 |

OTHER PUBLICATIONS

Stanley Wolf and Richard N. Tauber, Silicon Processing For The VLSI Era, 1986, Lattice Press, vol. I, pp. 437-442.*
Stanley Wolf and Richard N. Tauber, Silicon Process For The VLSI Era, 2000, Lattice Press, Second Edition, pp. 202-206 and 833-834.*

* cited by examiner

Primary Examiner—Michael Lebentritt
Assistant Examiner—Stanetta Isaac

(57) ABSTRACT

The present invention provides a method of fabricating a doped semiconductor region comprising selectively implanting a first impurity to form a shallow heavily doped region. The method further comprises selectively implanting the first impurity to also form a deep more heavily doped region, disposed laterally within the shallow heavily doped region and vertically within and below the shallow heavily doped region. In an optional feature of the present invention, the method further comprises selectively implanting a second impurity, wherein the doping profile of the deep more heavily doped region is graded.

12 Claims, 6 Drawing Sheets

METHOD FOR MANUFACTURING A DOUBLE BITLINE IMPLANT

FIELD OF THE INVENTION

Embodiments of the present invention relate to transistor fabrication, and more particularly to source and/or drain region doping.

BACKGROUND OF THE INVENTION

Referring to FIG. 1, a flow diagram of a method of manufacturing a doped region of a transistor according to the conventional art is shown. As depicted in FIG. 1, the process begins with various initial steps performed on a wafer, at step 105. The initial steps may include processes such as cleaning, etching, deposition, and the like.

Next at step 110, an oxide layer is formed on the substrate. Typically, the oxide can be formed by any well-known oxidation, deposition, or the like process. Next, at step 115 a polysilicon layer is deposited on the oxide layer. The polysilicon layer can be formed by any well-known deposition process, such as chemical vapor deposition (CVD), or the like.

Next, at step 120, a resist layer is formed on the polysilicon layer. The resist can be any well-known light-sensitive polymer. Next, at step 125, the resist layer is patterned. The resist can be patterned utilizing any well-known lithography process.

Next at step 130, the polysilicon layer is selectively etched to expose portions of the substrate. The polysilicon layer may be patterned by any well-known method, such as dry etching, ion etching, or the like.

Next at step 135, the patterned resist is then removed by applying a resist stripper, which causes the resist to swell and lose adhesion to the surface upon which it is applied.

Next, at step 140, the present embodiment selectively dopes the exposed portions of the substrate. The doping can be performed by any well-known diffusion, implant, or the like process. For example, source and drain regions are defined by openings in the patterned polysilicon layer. An impurity is then introduced into the exposed portions of the substrate utilizing a particle accelerator. In a N-channel implementation, the donor impurity may be phosphorus, arsenic, or the like, having an implanted concentration of approximately $5 \times 10^{14}$-$5 \times 10^{15}$ atoms per cubic centimeter. In an P-channel implementation, the acceptor impurity may be boron, or the like, having an implanted concentration of approximately $5 \times 10^{14}$-$5 \times 10^{15}$ atoms per cubic centimeter. Optionally, the doping may also be utilized to selectively dope the patterned polysilicon layer (e.g., gate and the like).

Finally, at step 145, fabrication proceeds with various subsequent processing steps. The subsequent steps may include processes such as deposition, etching, annealing, cleaning, polishing, metalization, passivation, and/or the like.

Referring now to FIG. 2, a section view of a partially fabricated transistor 200 according to the conventional art is shown. As depicted in FIG. 2, the transistor is fabricated in and about a substrate 205. The substrate may either be p-type or n-type semiconductor material, for n-channel or p-channel respectively.

A thin oxide layer 210 is formed upon the surface of the substrate 205. The oxide layer 210 is typically formed by oxidizing the surface of the substrate. For example, if the substrate material is silicon (Si) and the oxidizing agent is oxygen (O), an oxide layer of silicon dioxide ($SiO_2$) is formed A polysilicon layer 215 is then formed upon the thin oxide layer 210. The polysilicon layer can be formed by any well-known deposition process. The polysilicon layer is then patterned to form one or more structures, such as a gate, or the like. The patterned polysilicon layer can be formed by any well-known method, such as potolithography and selective etching.

One or more sources 220 and/or drains 225 are then formed by implanting an impurity 230 into the substrate that is left exposed by the patterned polysilicon layer 215. Typically the impurity implant results in a source 220 and/or drain 225 having a substantially uniform doping profile with a depth of approximately 0.1 μm. In a p-type substrate implementation, the doping of the source 220 and/or drain 225 is provided by an impurity 230 such as phosphorus, arsenic, or the like, having an implanted concentration of approximately $5 \times 10^{14}$-$5 \times 10^{15}$ atoms per cubic centimeter. In an n-type substrate implementation, the doping of the source 220 and/or drain 225 is provided by an impurity 230 such as boron, or the like, having an implanted concentration of approximately $5 \times 10^{14}$-$5 \times 10^{15}$ atoms per cubic centimeter.

The doping levels of the source and/or drain regions affect device resistances and capacitances. To reduce the resistance of the source, drain, bitline and/or contact between such, the doping level should be as high as practical. However, high doping levels result in degraded performance of short channel transistors. For example, heavily doped source and/or drain regions result in depletion regions at the source/substrate and/or drain/substrate junctions, which extend primarily into the lightly doped channel region of the substrate. Punch through occurs when the depletion regions of the source/substrate and the drain/substrate junctions meet. Punch through results in a relatively high source to drain leakage current. In the convention art, to avoid punch through the channel length is maintained at a longer length than current fabrication techniques make possible, which inhibits further scaling. Alternatively, the source and/or drain region doping is reduced. However, reducing the doping level results in a higher resistance of the source, drain, and/or bitline. In addition, the diffusion region of each source/substrate and/or drain/substrate junction also comprises a capacitance. The greater that doping level the larger the depletion region of the source/substrate and/or drain/substrate junction. Hence, the high doping concentration results in a high junction capacitance.

As described above, the convention art is problematic in that increasing the doping concentration, to decrease resistance, increases short channel effects. The conventional art is also problematic in that increasing the doping concentration, to decrease resistance, also increases junction capacitance. Thus, there is a need for an improved source and/or drain region providing for reduced short channel effects, reduced source and/or drain region resistance, and/or reduced depletion region capacitance.

SUMMARY OF THE INVENTION

The present invention provides an improved doped region. Embodiments of the present invention provide a source and/or drain region adapted to reduce short channel effect. Embodiments of the present invention provide a doped region adapted to reduce resistance therein. Embodiments of the present invention provide a doped region adapted to reduce depletion region capacitance.

In one embodiment, the present invention provides a method of fabricating a doped semiconductor region comprising selectively implanting a first impurity to form a shallow heavily doped region. The method further comprises selectively implanting the first impurity to also form a deep more heavily doped region, disposed laterally within the shallow heavily doped region and vertically within and below the shallow heavily doped, region.

In another embodiment of the present invention, a semiconductor device comprises a channel, a gate disposed above the channel and a first compound doped region. The first compound doped region comprises a first shallow heavily doped region, disposed adjacent the channel. The first compound doped region further comprises a first deep more heavily doped region, disposed laterally separated from the channel and vertically within and bellow the first shallow heavily doped region.

In another embodiment, the present invention provides a method of forming a compound doped structure comprising forming a first implant barrier having an opening on a substrate. A first doped region is formed in the substrate, disposed at a first depth and aligned with the opening of the first implant barrier. A second implant barrier is also formed, having an opening disposed within the opening of the first implant barrier. A second doped region is also formed in the substrate, disposed at a second depth and aligned with the opening of the second implant barrier. The depth of the second doped region is greater than the depth of the first doped region.

BRIEF DESCRIPTION OF THE DRAWINGS

The present invention is illustrated by way of example and not by way of limitation, in the figures of the accompanying drawings and in which like reference numerals refer to similar elements and in which.

Prior Art

Prior Art

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
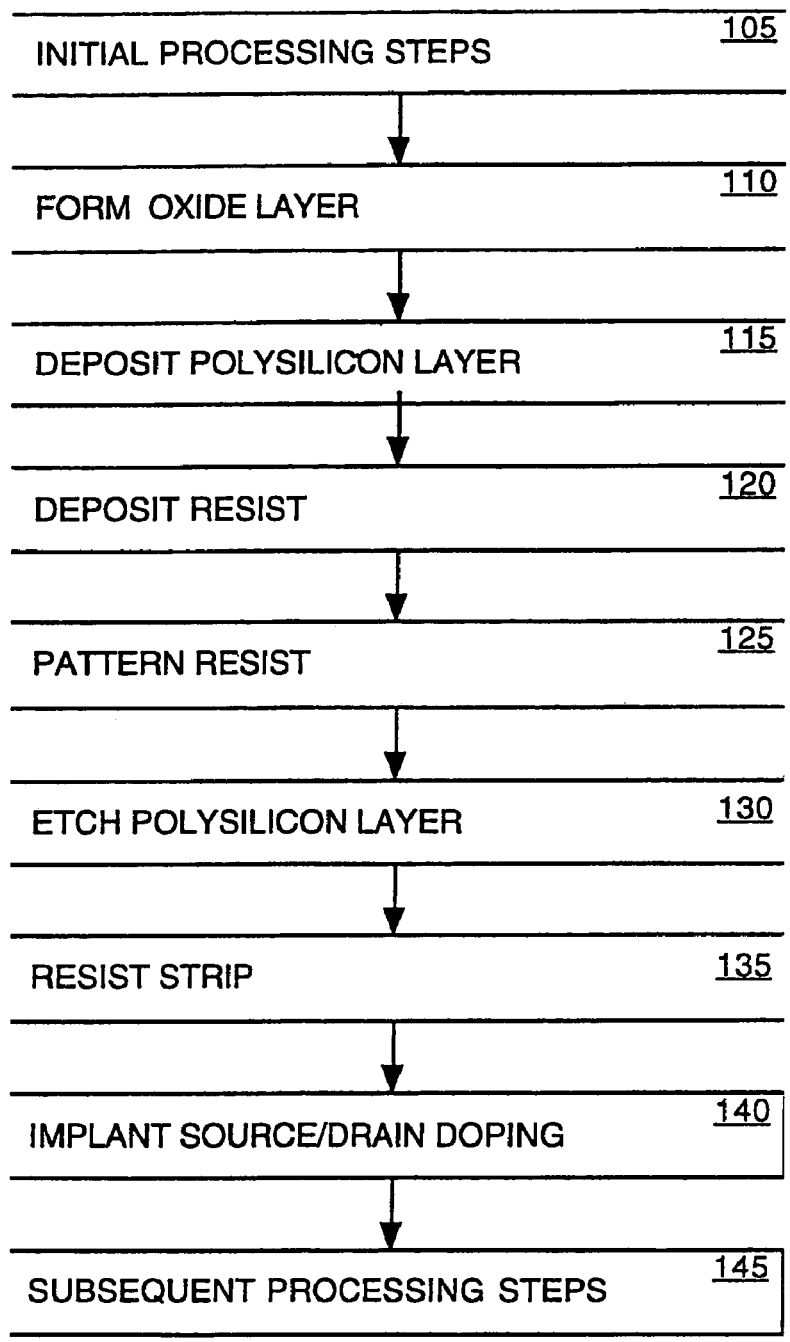
FIG. 1 shows a flow diagram of a method of manufacturing a doped region of a transistor according to the conventional art.
Figure 2:
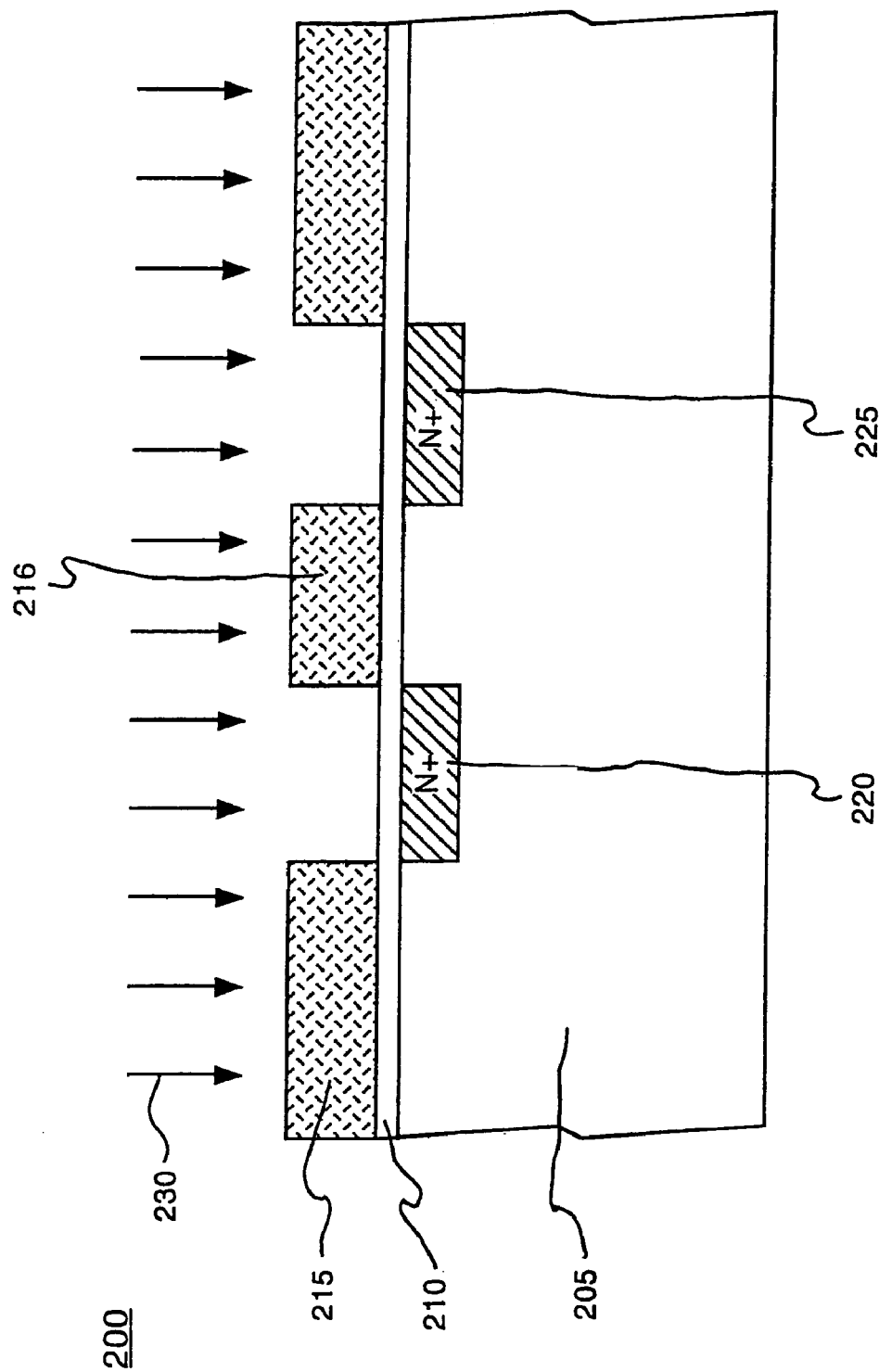
FIG. 2 shows a section view of a partially fabricated transistor according to the conventional art.
Figure 3:
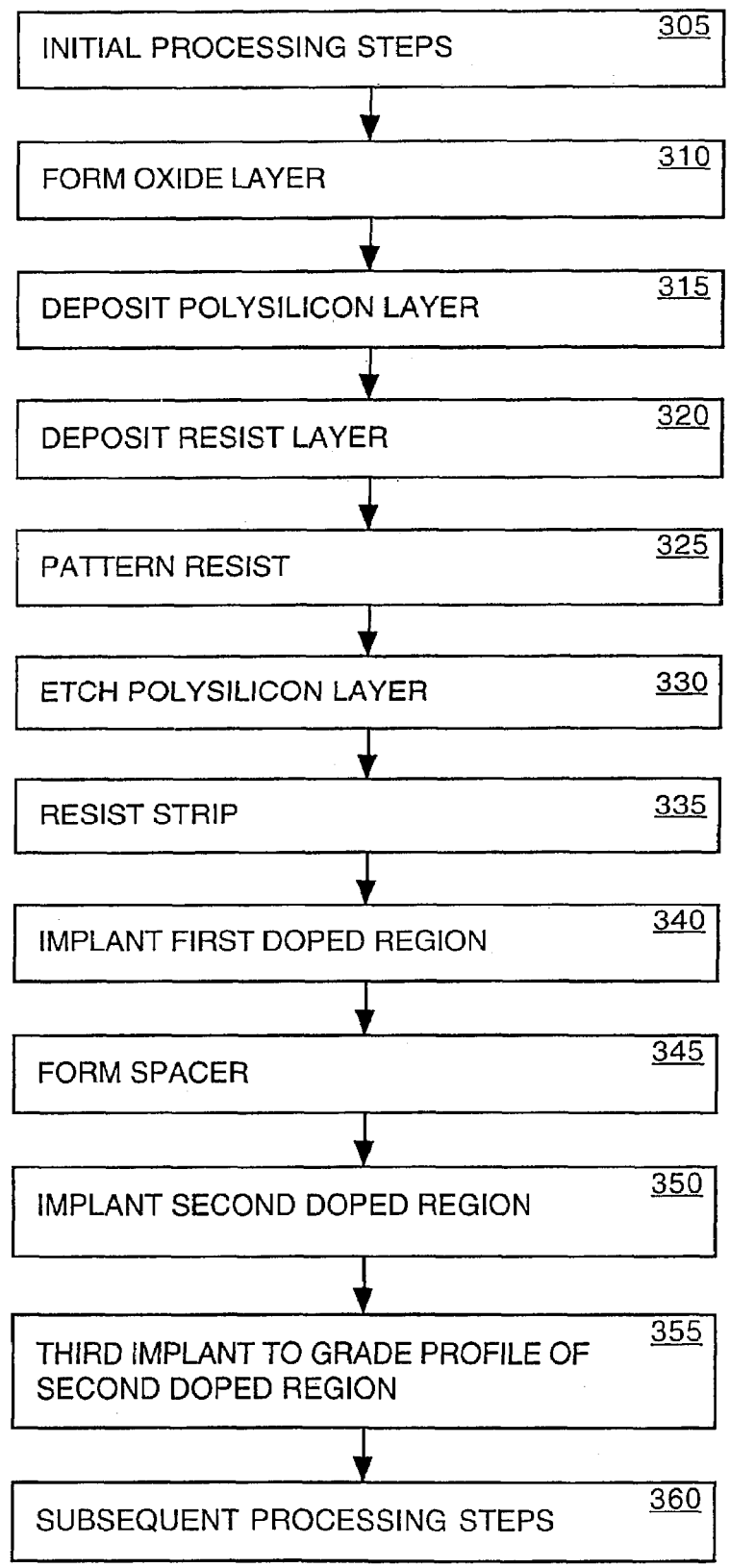
FIG. 3 shows a flow diagram of a method of manufacturing a compound doped region, in accordance with one embodiment of the present invention.

Referring to FIG. 3, a flow diagram of a method of manufacturing a compound doped region, in accordance with one embodiment of the present invention, is shown. In one embodiment, the compound doped region may comprise a source, drain, bitline and/or the like. As depicted in FIG. 3, the process begins with various initial steps performed on a wafer, at step 305. In the present embodiment, the initial steps may include processes such as cleaning, etching, deposition, and the like.

In the present embodiment, an oxide layer is formed on a wafer, at step 310. In one embodiment, the oxide can be formed by any well-known oxidation, deposition, or the like process. In an exemplary oxidation process, the substrate material of the wafer is silicon (Si) and is exposed to an oxygen (O) in an oxidizing furnace providing a dry or steam ambient at a temperature of approximately 700-1200° centigrade. A resulting silicon dioxide ($SiO_2$) layer approximately 50-200 Å thick is formed, in approximately 1-60 minutes.

In the present embodiment, a polysilicon layer is deposited on the oxide layer, at step 315. In one embodiment, the polysilicon layer can be formed by any well-known deposition process, such as chemical vapor deposition (CVD), or the like. In an exemplary embodiment, saline (SiH4) gas is supplied at approximately 600-650° centigrade for approximately 15-120 seconds in a low-pressure chemical vapor deposition reactor. A polysilicon (Si) layer approximately 20-200 Å thick, is thereby conformally deposited on the wafer surface, and hydrogen ($2H_2$) is produced as a byproduct.

In the present embodiment, a resist layer is formed on the polysilicon layer, at step 320. In one embodiment, the resist can be any well-known light-sensitive polymer. In an exemplary embodiment, the resist layer can be formed by applying 2-10 milliliters (ml) of a liquid light-sensitive polymer on a rapidly spinning surface of the wafer, and then allowing the light-sensitive polymer to dry.

In one embodiment, the resist layer is patterned utilizing any well-known lithography process, at step 325. In an exemplary embodiment, a mask containing a pattern of transparent and opaque areas corresponding to the desired gate region is placed over the resist. The resist is then exposed to ultraviolet or near-ultraviolet light through the transparent portions of the mask. For a negative resist, the molecules of the resist are polymerized (cross-lined) in areas exposed to the light. For a positive resist, molecular bonds are broken where the resist is illuminated. The unexposed portions of the resist remain unaffected. The unpolymerized areas of the resist are then selectively dissolved in a chemical wash, thereby forming a patterned resist.

In the present embodiment, the polysilicon layer is patterned by any well-known isotrophic etching method, such as dry etching, ion etching, or the like, at step 330. In one embodiment, the polysilicon layer is exposed to a plasma, which is an almost neutral mixture of energetic molecules, ions, and electrons that have been excited by radio frequency or microwave energy. The excited species interact chemically with portions of the polysilicon layer, thereby allowing the ions to knock away atoms in the polysilicon layer exposed by the patterned resist. In one embodiment, the patterned polysilicon layer may comprise a plurality of gates, control gates, floating gates, bitlines, wordlines and/or the like structures. In an exemplary embodiment, the resulting gate should have a width and length substantially equal to a desired channel width and length. The patterned polysilicon also comprises an implant barrier, wherein the substrate is exposed by a plurality of openings in the polysilicon layer In the present embodiment, the patterned resist is then removed by applying a resist stripper, at step 335. The resist stripper causes the resist to swell and lose adhesion to the surface upon which it is applied.

Next, at step 340, the present embodiment selectively implants impurities into the substrate, such that a first doped region is formed. The first doped region is defined by, and aligned with, the patterned polysilicon. In one embodiment, the first implant may be performed by any well-known diffusion, implant, or the like process. In an exemplary embodiment, the implant may be performed by a particle accelerator. In a p-channel device, the dopant may be a donor impurity such as phosphorus, arsenic or the like, having an implanted concentration of approximately $1 \times 10^{15}$-$2 \times 10^{15}$ atoms per cubic centimeter. In an n-channel device, the dopant may be an acceptor impurity such as boron or the like, having an implanted concentration of approximately $1 \times 10^{15}$-$2 \times 10^{15}$ atoms per cubic centimeter. In an exemplary embodiment, the impurities are implanted to a depth of up to approximately 0.1 μm.

In the present embodiment, a spacer is formed adjacent the edges of the implant barrier (e.g., patterned polysilicon), at step 345. In one embodiment, the spacer may be formed by deposited a nitride layer utilizing any well-known deposition process, such as chemical vapor deposition (CVD), or the like. A resist layer is then formed and patterned on the nitride layer. The nitride layer is then selectively etched by any well-known anisotrophic etching method, such as wet etching, or the like.

In an exemplary embodiment, the spacers are formed adjacent the gates. The spacers form openings aligned with, but slightly smaller than, the previously formed openings in the patterned polysilicon layer.

Next, at step 350, the present embodiment selectively implants impurities into the substrate, such that a second doped region is formed. In one embodiment, the second doped region is defined by, and aligned with the spacer. The second implant may be performed by any well-known diffusion, implant, or the like process. In an exemplary implementation, implanting may be performed by a particle accelerator. In a p-channel devices, the dopant may be a donor impurity such as phosphorus, arsenic or the like, having an implanted concentration of approximately $1 \times 10^{15}$-$2 \times 10^{15}$ atoms per cubic centimeter. In an n-channel device, the dopant may be an acceptor impurity such as boron or the like, having an implanted concentration of approximately $1 \times 10^{15}$-$2 \times 10^{15}$ atoms per cubic centimeter. In an exemplary implementation, the impurities are implanted to a depth of up to approximately 0.2-0.3 μm.

In optional step 355, a third implant may be performed to provide a graded doping profile of the second doped region step 350. In one embodiment, the impurity utilized in the third implant should be an acceptor, such as boron, when second doped regions are formed by a donor implant, such as arsenic. If the second doped regions are formed by an acceptor implant, the third implant should be a donor. In one embodiment, the third implant preferably has a higher diffusivity than the impurity utilized as the second implant. Thus, during subsequent thermal cycling the third implant will diffuse more quickly than the second implant. As a result, the effective doping profile of the second doped regions will be graded along the junction region. The graded doping profile results in a smaller depletion region, and hence a smaller junction capacitance.

In the present embodiment, fabrication proceeds with various subsequent processing steps, at step 360. In one embodiment, the subsequent steps may include processes such as deposition, etching, annealing, cleaning, polishing, metalization, passivation, and/or the like.

The present embodiment is advantageous in that a shallow heavily doped region is formed. A deep more heavily doped region formed laterally within the shallow heavily doped region, and vertically within and below the shallow heavily doped region. The shallow heavily doped region may advantageously be utilized to reduce short channel effects in transistors, memory cells, and the like. The deep more heavily doped region may advantageously be utilized to reduce source, drain and/or bitline resistance, without increasing short channel effects. The optional third implant, utilized to grade the doping profile of the deep more heavily doped region, may advantageously be utilized to reduce capacitance associated with source/substrate, drain/substrate and/or ohmic contact depletion regions.

Figure 4A:
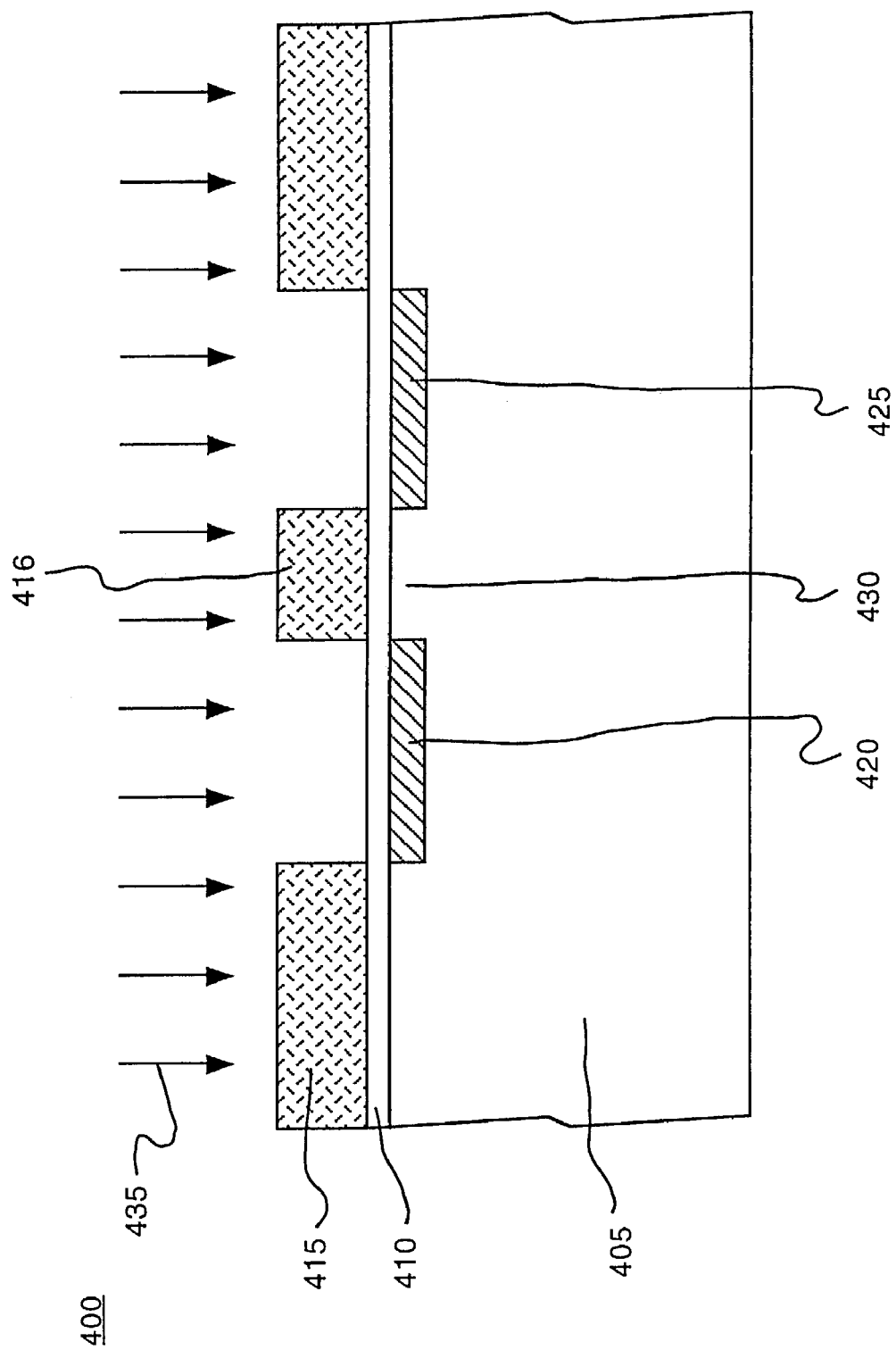
FIGS. 4A-4C show sectional views of a partially fabricated semiconductor device, in accordance with one embodiment of the present invention.
Figure 4B:
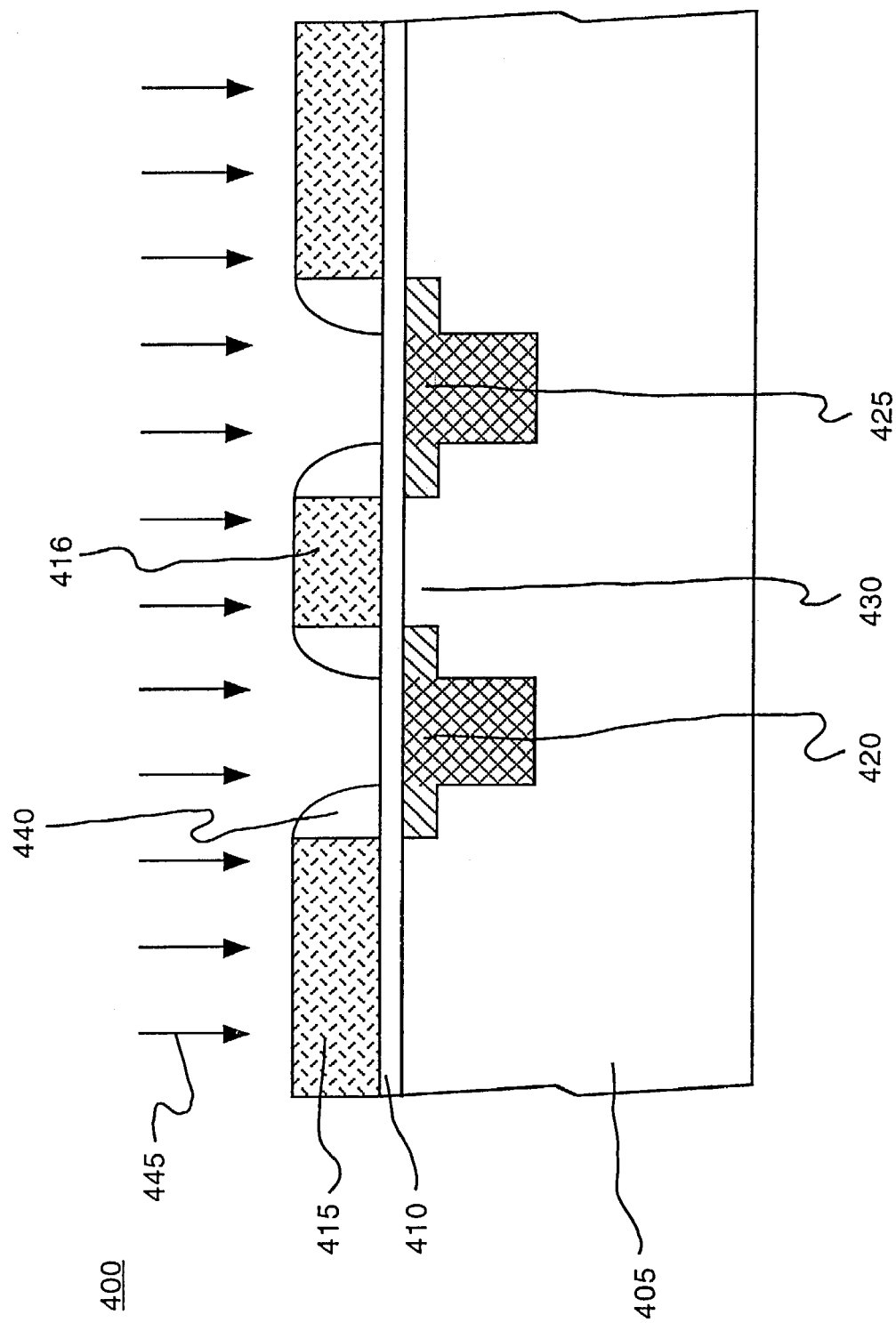
Figure 4C:
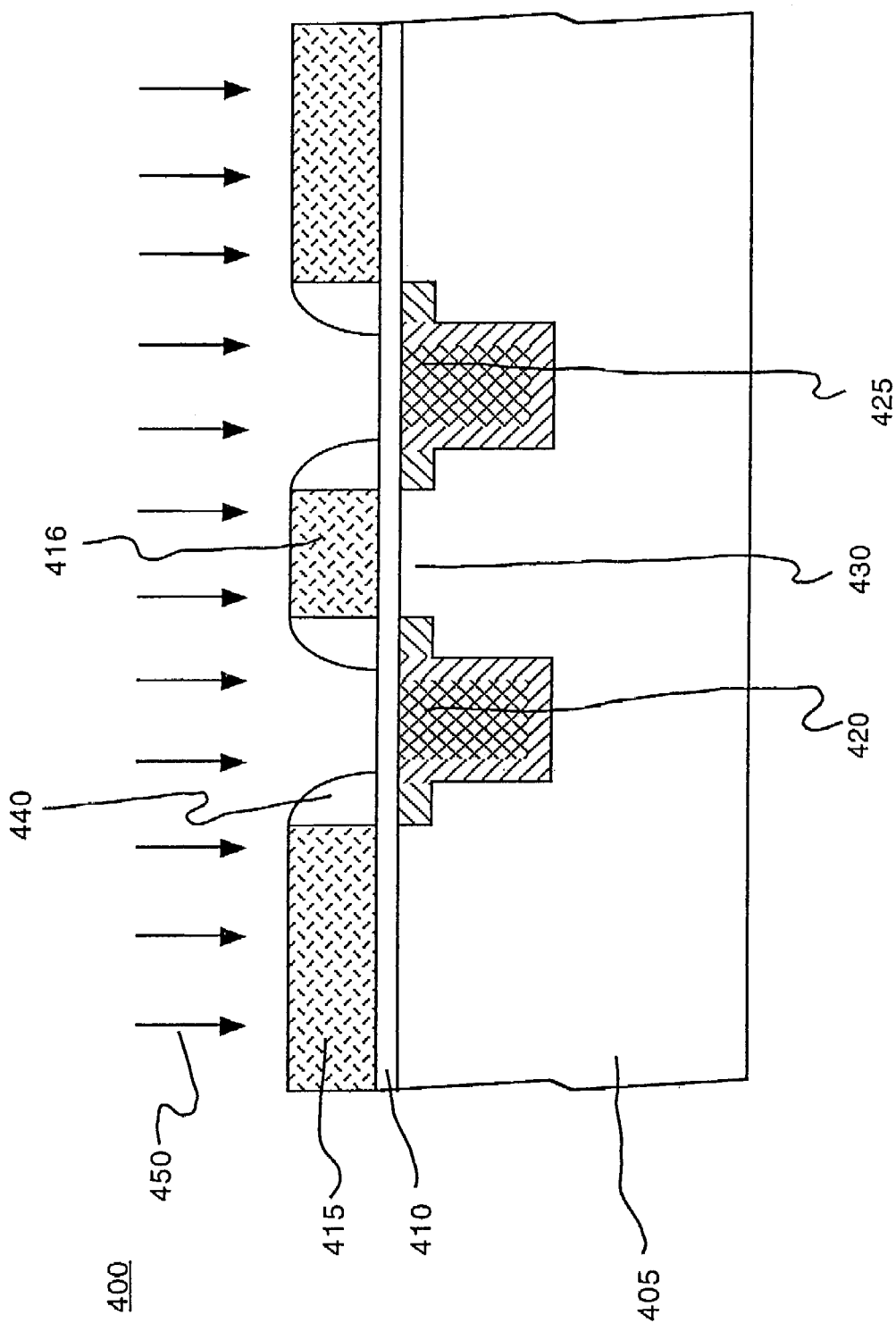

Referring now to FIGS. 4A-4C, sectional views of a partially fabricated semiconductor device 400, in accordance with one embodiment of the present invention, is shown. In one embodiment, the semiconductor device 400 may be transistors, metal-oxide-silicon field effect transistors (MOSFETs), floating gate type flash memory cells, and/or the like. As depicted in FIG. 4A, the semiconductor device 400 of the present embodiment is fabricated on a substrate 405. The substrate 405 may either be p-type or n-type semiconductor material.

In the present embodiment, a thin oxide layer 410 is formed upon the surface of the substrate 405. In one embodiment, the oxide layer 410 may be formed by oxidizing the surface of the substrate 405. In an exemplary embodiment, if the substrate 405 material is silicon (Si) and the oxidizing agent is oxygen (O), an oxide layer 410 of silicon dioxide ($SiO_2$) is formed. In an exemplary embodiment, the oxide layer 410 is approximately 50-200 Å thick.

In the present embodiment, a polysilicon layer 415 is then formed upon the thin oxide layer 410. In one embodiment, the polysilicon layer 415 can be formed by any well-known deposition process. In one embodiment, the polysilicon layer 415 may be patterned by any well-known method, such as potolithography and selective etching. In one embodiment, the patterned polysilicon layer 415 comprises one or more structures, such as a gate, a control gate, a floating gate, a bitline, a wordline, and/or the like. In an exemplary embodiment, the patterned polysilicon layer 415 comprises a gate 416, which is approximately 20-200 Å thick, 50-150 Å wide, and 500-1500 Å long.

In the present embodiment, one or more compound doped regions are then formed by implanting an impurity 435 into the portion of the substrate 405 that is left exposed by the patterned polysilicon layer 415. In one embodiment, the patterned polysilicon layer 415 is utilized as an implant mask, thereby forming a first and second compound regions that are self-aligned to the gate. In one embodiment, the implanting may be performed by a particle accelerator or the like. In an exemplary embodiment, the first and second compound doped regions comprise a source 420 and a drain 425 region separated by a channel region 430. The channel region 430 is approximately the width and length of the overlying gate 416.

In the present embodiment, a first depth of the implanted impurities 435 is selected such that shallow heavily doped regions are formed. In a p-type substrate implementation, the implant of the shallow heavily doped regions are provided by a donor impurity 435 such as phosphorus, arsenic or the like, having an implanted concentration of approximately $0.5 \times 10^{15}$-$1.5 \times 10^{15}$ atoms per cubic centimeter. In an n-type substrate implementation, the implant of the shallow heavily doped regions are provided by an acceptor impurity 435 such as boron or the like, having an implanted concentration of approximately $1 \times 10^{15}$-$2 \times 10^{15}$ atoms per cubic centimeter.

In an exemplary embodiment, the impurity 435 in the shallow heavily doped region is arsenic having a concentration of approximately $1 \times 10^{15}$ atoms per cubic centimeter. The arsenic is implanted to a depth of up to approximately 0.1 μm.

As depicted in FIG. 4B, a plurality of spacers 440 are formed adjacent the patterned polysilicon layer 415, in the present embodiment. In one embodiment, the spacers 440 can be formed by well-known chemical vapor deposition, photo-lithography and selective etching processes. In an exemplary embodiment, the spacers 446 are formed by depositing and patterning a nitride layer.

In the present embodiment, impurities 445 are further implanted into the compound doped region to form deep more heavily doped regions. In the present embodiment, the spacers 440 and patterned polysilicon layer 415 are utilized as masks during the impurity 445 implanting. In one embodiment, a second depth of the implanted impurities 445 is selected such that the deep more heavily doped regions are formed laterally within and vertically with and below the shallow heavily doped regions. In a p-type substrate implementation, the implant of the deep more heavily doped region are provided by a donor impurity 445 such as phosphorus, arsenic or the like, having an implanted concentration of approximately $1.5 \times 10^{15}$-$2.5 \times 10^{15}$ atoms per cubic centimeter. In an n-type substrate implementation, the implant of the deep more heavily doped regions are provided by an acceptor impurity 445 such as boron or the like, having an implanted concentration of approximately $1 \times 10^{15}$-$2 \times 10^{15}$ atoms per cubic centimeter.

In an exemplary embodiment, the impurity 445 in the deep more heavily doped regions is arsenic having a concentration of approximately $2 \times 10^{15}$ atoms per cubic centimeter. The arsenic is implanted to a depth of up to approximately 0.2 μm.

In the exemplary embodiment where the first and second doped regions comprise a source 420 and/or a drain 425, the doping level of the shallow heavily doped regions is selected such that short channel effects are reduced. The deep more heavily doped regions are also spaced away from the channel region 430 but self-aligned to the gate 416. The doping level of the deep more heavily doped regions is selected such that bitline resistance is reduced without increasing the short channel effects.

Optionally, as depicted in FIG. 4C, the deep more heavily doped regions may be further doped to grade the doping profile of the deep more heavily doped region. In one embodiment, if the more deep heavily doped regions are formed by an n-type dopant, the optional implant should be a light doping of a p-type impurity 445. If the deep more heavily doped regions are formed by a p-type dopant, the optional implant should be a light doping of an n-type impurity 445. In an exemplary embodiment, the impurity 445 is the utilized for grading the doping profile of the deep more heavily doped region is boron having a concentration of approximately $0.5 \times 10^{15}$ atoms per cubic centimeter. The boron is implanted to a depth of up to approximately 0.2 μm.

In the exemplary embodiment where the first and second compound doped regions comprise a source 420 and a drain 425, the optional graded doping profile of the deep more heavily doped regions proximate the substrate 405 act to reduce the source/substrate and/or drain/substrate depletion regions. In one embodiment, the reduced depletion regions act to reduce the source 420 and/or drain 425 capacitances.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of fabricating a doped semiconductor region comprising:

selectively implanting a first impurity of a first conductivity type to form a first heavily doped region;

selectively implanting said first impurity to form a second heavily doped region, wherein said second region is disposed laterally within said first region and vertically within and below said first region, and wherein said second region is more heavily doped than said first region;

selectively implanting a second impurity of a second conductivity type to form a third doped region, wherein said second impurity has a higher diffusivity than said first impurity, and wherein said second conductivity type is not the same as said first conductivity type, wherein said third region is disposed within said second heavily doped region and within and vertically below said first region, wherein said first, second and third doped regions form a compound doped region; and annealing, wherein a doping profile of said second heavily doped region is graded along a junction region, wherein said graded doping profile results in decreased junction capacitance.

2. The method according to claim 1, wherein said selectively implanting said first impurity to form said first heavily doped region comprises:

forming a first implant barrier having a first opening; and forming a first doped region in a first portion of a substrate exposed by said first opening.

3. The method according to claim 2, wherein said selectively implanting said first impurity to form said second heavily doped region comprises:

forming a second implant barrier, having a second opening disposed within said first opening; and forming a second doped region in a second portion of said substrate exposed by said second opening.

4. The method according to claim 1 wherein said first impurity of said first conductivity type is a donor impurity, and wherein said second impurity of said second conductivity type is an acceptor impurity.

5. The method according to claim 1 wherein said first impurity of said first conductivity type is an acceptor impurity, and wherein said second impurity of said second conductivity type is a donor impurity.

6. A method of forming a compound doped structure comprising:

forming a first implant barrier on a substrate, having a first opening;

implanting said substrate exposed by said first opening with a first conductivity type of impurity to form a first doped region;

forming a second implant barrier, having a second opening disposed within said first opening;

implanting said substrate exposed by said second opening with said first conductivity type of impurity to form a second doped region, wherein said first conductivity type of impurity has a first diffusivity, and wherein said second doped region is disposed laterally within said first region and vertically within and below said first region, and wherein said second region is more heavily doped than said first region;

implanting said substrate exposed by said second opening with a second type conductivity of impurity to form a third doped region, wherein said second type of impurity has a second diffusivity, wherein said second type of impurity is not the same as said first type of impurity, wherein said third doped region is disposed within said second heavily doped region and within and vertically below said first region, and wherein said first, second and third doped regions form a compound doped region;

annealing said substrate, wherein a first doped region disposed at a first depth and aligned with said first opening is formed, and wherein said second doped region comprises a graded doping profile as a function of said first diffusivity and said second diffusivity, wherein said graded doping profile results in decreased function capacitance.

7. The method recited in claim 6, wherein forming said first implant barrier comprises forming one or more structures consisting of a gate, a control gate, a floating gate, a bitline, and a wordline.

8. The method recited in claim 7, wherein forming said gate comprises:
depositing a polysilicon layer;
depositing a resist layer;
patterning said resist layer;
selectively etching said polysilicon layer.

9. The method recited in claim 7, wherein forming said second implant barrier comprises forming a spacer.

10. The method recited in claim 9, wherein forming said spacer comprises:
depositing a nitride layer;
depositing a resist layer;
patterning said resist layer;
selectively etching said nitride layer.

11. The method recited in claim 6, wherein said first conductivity type of impurity is a donor impurity, and wherein said second type conductivity of impurity is an acceptor impurity.

12. The method recited in claim 6, wherein said first conductivity type of impurity is an acceptor impurity, and wherein said second type conductivity of impurity is a donor impurity.

* * * * *